United States Patent [19]
DeCarlo, Jr.

[11] Patent Number: 5,867,058
[45] Date of Patent: Feb. 2, 1999

[54] METHOD AND SYSTEM FOR ENHANCING A DIGITALLY SAMPLED VOLTAGE INPUT WAVEFORM

[75] Inventor: Robert D. DeCarlo, Jr., Palatine, Ill.

[73] Assignee: Zenith Electronics Corporation, Glenview, Ill.

[21] Appl. No.: 904,902

[22] Filed: Aug. 1, 1997

[51] Int. Cl.$^6$ .............................. H03B 1/00; H03K 5/00
[52] U.S. Cl. .......................... 327/551; 327/557; 327/558; 327/559
[58] Field of Search ..................................... 327/551, 552, 327/553, 555–559, 352, 361; 341/143; 330/305–307, 109; 333/173, 172

[56] References Cited

U.S. PATENT DOCUMENTS

| | | | |
|---|---|---|---|
| 4,758,903 | 7/1988 | Noguchi et al. | 360/19.1 |
| 5,300,838 | 4/1994 | Elizondo | 327/555 |
| 5,349,381 | 9/1994 | Murayama et al. | 348/252 |

Primary Examiner—My-Trang Nu Ton

[57] ABSTRACT

A method and system for enhancing a digital input signal and producing a modified digital output signal that can either be further digitally processed or that can be converted to an analog signal. A digital input signal passes through a low-pass filter, a high-pass filter and a bandpass filter. A digital signal emitted from a high-pass section of the bandpass filter is delivered to a dynamically-controlled multiplier operating in a digital domain. Digital signals emitted from the low-pass filter, the high-pass filter and the bandpass filter are summed with a signal multiplied by the dynamically-controlled multiplier. A process controller and a contour controller can be used to vary low-frequency boost and high-frequency boost delivered by the modified digital input signal which can then be converted to an analog audio output sample.

16 Claims, 4 Drawing Sheets

METHOD AND SYSTEM FOR ENHANCING A DIGITALLY SAMPLED VOLTAGE INPUT WAVEFORM

BACKGROUND OF THE INVENTION

1. Field of the Invention

This invention relates to a method and system for efficiently modifying a digitally sampled voltage input waveform to produce an output signal, particularly where the output signal is used to produce a corrected audio signal.

2. Description of Prior Art

In conventional Pulse-Code Modulation (PCM) technology, a signal is periodically sampled then quantized into a discrete number of levels, such as voltage levels, and subsequently coded as a sequence of digits. For a general explanation of PCM, see Bernard Sklar, *Digital Communications Fundamentals and Applications*, p. 73 (1988 Prentice-Hall, Inc.). Depending upon resolution of quantization, or number of binary bits per sample, and the sampling rate selected, the PCM representation can closely approximate an original continuous or analog signal. For example, electronic compact disc players typically employ a PCM signal. The term "voltage" can relate to a sequence of PCM samples.

Conventional analog systems exist for correcting amplifier loads to overcome phase lagging characteristics of an output signal delivered to an audio output device, such as a speaker. For example, Crooks, U.S. Pat. No. 4,482,866 and Crooks, U.S. Pat. No. 4,638,258 disclose a reference load amplifier correction system that corrects for adverse analog signal characteristics, such as reactance, inertia and resonances of an analog power amplifier driven load, such as a speaker. A program voltage is applied to a reference load that resembles or simulates characteristics of a driven load. A correction voltage signal is delivered as a function of the reference load. The program voltage and the correction voltage signal are simultaneously applied to the power amplifier to simultaneously reproduce the program and correct for adverse load characteristics. The amplifier correction systems taught by U.S. Pat. Nos. 4,482,866 and 4,638,258 deliver an analog audio signal to an audio output device that unmasks high-frequency harmonics by applying a phase lead to the high-frequency signals, relative to the low-frequency and midrange-frequency signals.

Gagon, U.S. Pat. No. 5,510,752 discloses a low input signal bandwidth compressor and amplifier control circuit which has a pre-amplifier responsive to an analog program input signal, a filter circuit and an absolute value circuit. The preamplifier automatically balances the high-frequency signals and the midrange-frequency signals, resulting in a compensated signal. The filter circuit has an adjustable bandwidth which automatically adjusts the bandwidth of the filter circuit in response to a control signal. The filter circuit uses a voltage-controlled amplifier or a photo cell in combination with an integrator. The absolute value circuit emits a control signal proportional to an average peak value of an amplitude of a modified compensated signal emitted from the filter circuit. The amplifier control circuit taught by U.S. Pat. No. 5,510,752 receives at an input terminal an analog signal.

It is apparent from the teachings of the prior art that there exists a need for a method and a system for digitally processing a digital input signal into a digital output signal that can be delivered to an audio output device wherein relatively lower frequencies phase lag relatively higher frequencies. There is also a need to independently adjust a level of relatively low-frequency energy and a level of relatively high-frequency energy, particularly where the relatively high-frequency level is also controlled by the content of the digital input signal.

SUMMARY OF THE INVENTION

It is one object of this invention to provide a method and system which more efficiently modifies an input signal in a digital domain to produce an enhanced output signal, particularly in a manner which is more efficient than deriving a similarly enhanced output signal with a conventional analog method and system.

It is another object of this invention to provide a method and system which uses a bandpass filter to more efficiently isolate a digital input signal to only particular frequencies which are delivered to a digital voltage controller.

It is still another object of this invention to provide a method which allows a user to variably control relatively high-frequency signal boost independently from relatively low frequency signal boost.

The above and other objects of this invention are accomplished with a method, according to one preferred embodiment, that delivers a digital input signal to a low-pass filter, a high-pass filter and a bandpass filter. The output signal from the low-pass filter is subtracted from the output signal of the bandpass filter, resulting in a first summed signal. The output signal from the high-pass filter is subtracted from the first summed signal, resulting in a second summed signal.

After the digital input signal passes through a high-pass section of the bandpass filter, the partially filtered signal is delivered to a control signal generator or a voltage controller of a dynamically controlled multiplier. A resulting voltage-controlled signal is then multiplied with a control input signal that can be variably selected as a function of a user input. The resulting or multiplied boost signal is used to control amplification of a high-frequency portion of the signal which is emitted from the high-pass filter. The second summed signal is subtracted from the amplified high-frequency signal, resulting in a third summed signal.

A low-frequency portion of the signal emitted from the low-pass filter is also multiplied, preferably in a controlled manner as a function of a user input. The multiplied low-frequency signal is added to the third summed signal to produce the enhanced output signal. The output signal can then be further digitally processed or can be converted to an analog signal and preferably but not necessarily delivered to an audio output device.

The method and system of this invention is particularly suitable for use with the Motorola DSP56K family of chips, which are commercially available from Motorola, Inc. Although other suitable digital signal processing chips or suitable computer hardware in any suitable program language, can be used to accomplish the same result of this invention, the Motorola DSP56K family of chips provides significantly reduced space requirements for designing and building printed circuit boards, such as those used in relatively small housings for audio hardware.

BRIEF DESCRIPTION OF THE DRAWINGS

The above-mentioned and other features and objects of this invention will be better understood from the following detailed description taken in conjunction with the drawings wherein.

DESCRIPTION OF PREFERRED EMBODIMENTS

Figure 1:
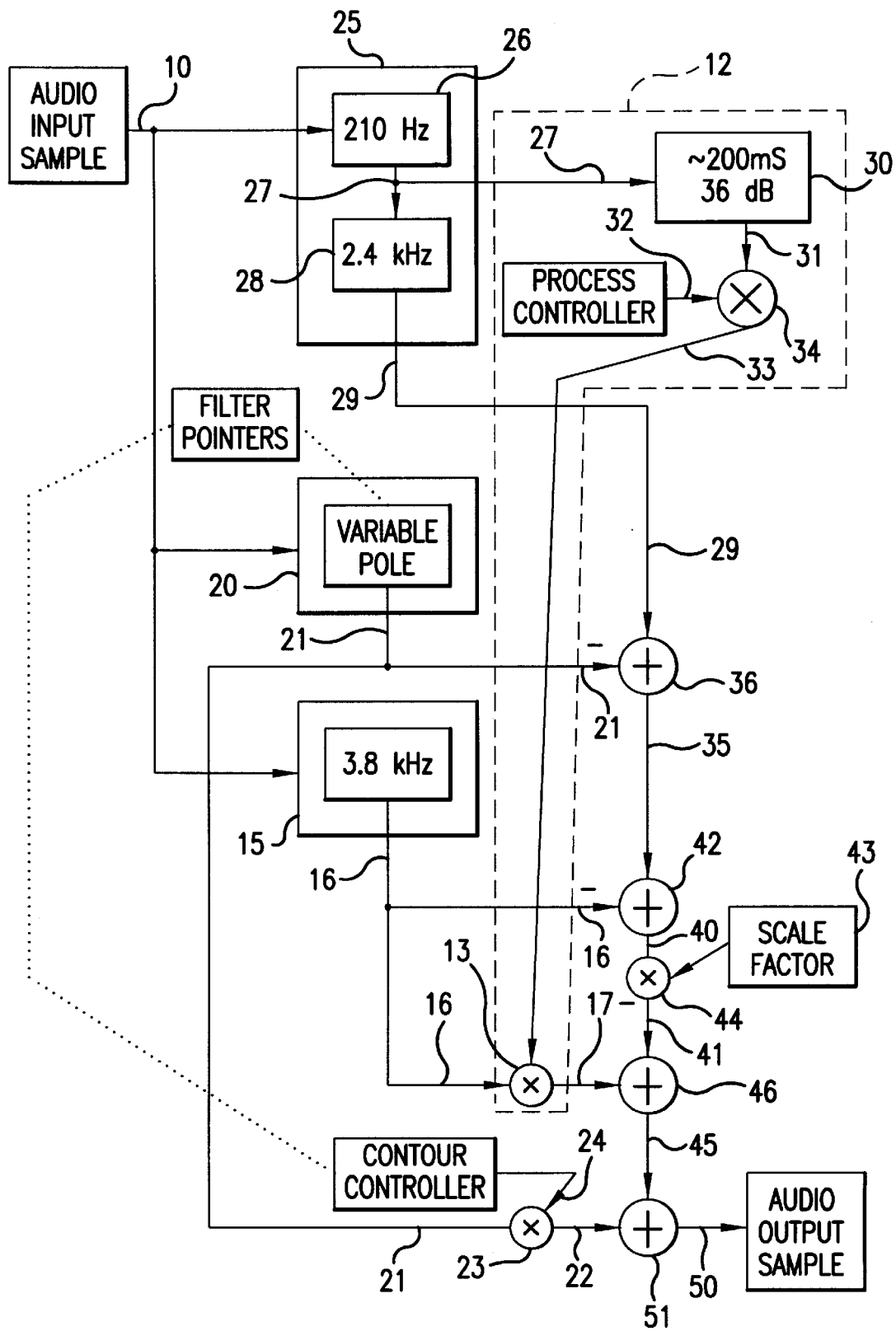
FIG. 1 is a block diagram showing a method and system for digitally enhancing a digital input signal, which according to one preferred embodiment of this invention operates with particular commercially available hardware and/or software.
Figure 2:
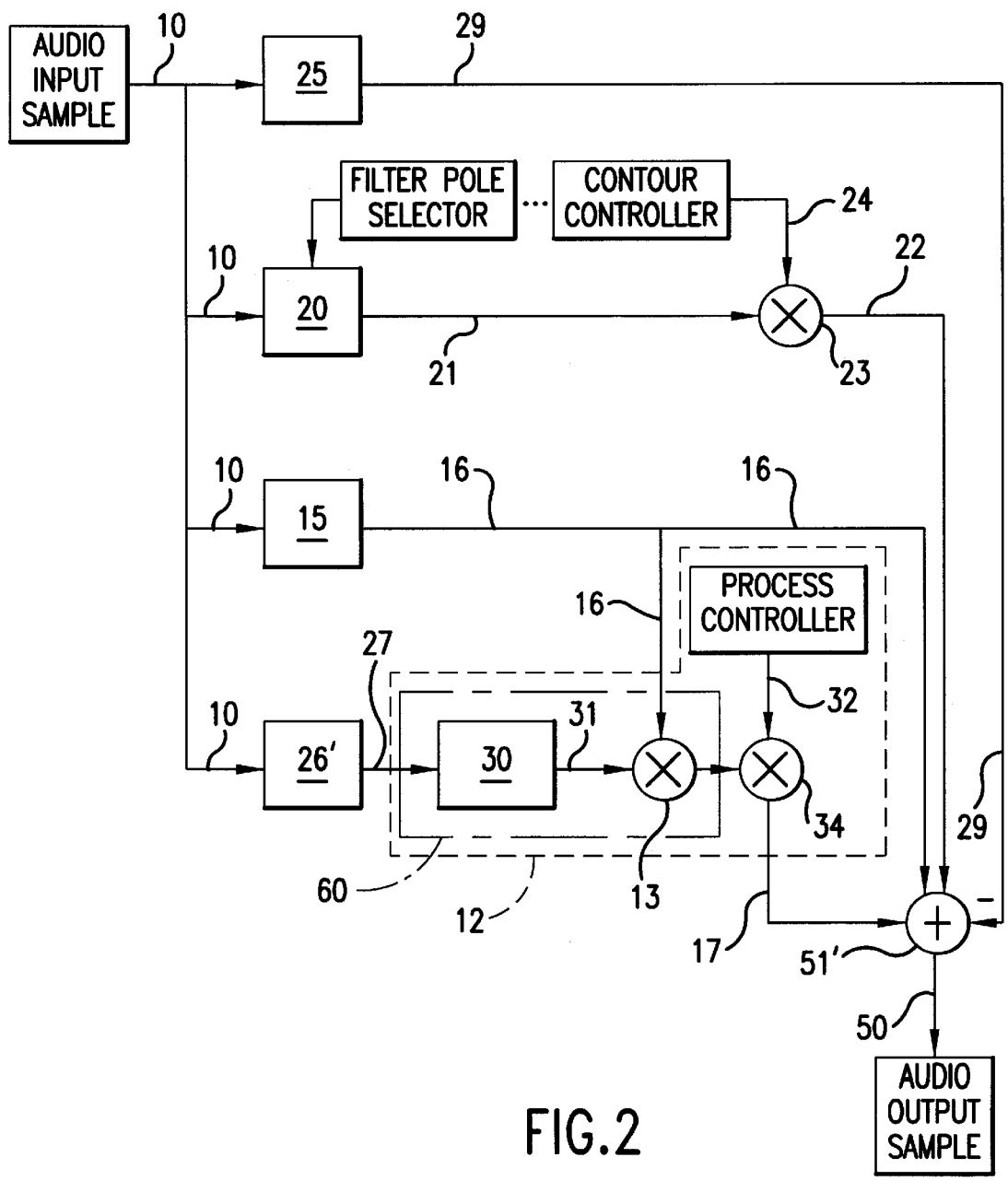
FIG. 2 is a block diagram showing a method and system for digitally enhancing a digital input signal, which according to another preferred embodiment of this invention operates more generically than the embodiment shown in FIG. 1, such as with commercially available hardware and/or software.

FIGS. 1 and 2 show a block diagram each representing a method and system, according to one preferred embodiment of this invention, for enhancing voltage input waveform 10, which is preferably digitally sampled and represents a digital signal. As used throughout this specification and in the claims, the phrase digital signal is intended to relate to a sequence of voltage samples and is intended to be interchangeable with the phrase voltage input waveform. For example, the digital signal may be a PCM signal, such as an output signal from a compact disc reader or an audio output signal from a high-definition television (HDTV). It is apparent that the input signal can be provided in digital form or an analog-to-digital converter can be used to convert an analog signal to a digital signal. Once processed according to the method of this invention, the digital output signal, shown as signal 50 in FIGS. 1 and 2, can then be further processed as a digital signal or can then be converted back to an analog signal.

As shown in FIGS. 1 and 2, voltage input waveform 10 passes through high-pass filter 15 which emits a high-frequency portion 16 of the digital signal corresponding to voltage input waveform 10. In one preferred embodiment according to this invention, high-pass filter 15 operates at a frequency of about 3.8 kHz; however, it is apparent that the frequency setpoint of high-pass filter 15 can be set at any suitable value. As shown in FIGS. 1 and 2, voltage input waveform 10 also passes through low-pass filter 20 which emits low-frequency portion 21 of the digital signal. In one preferred embodiment according to this invention, low-pass filter 20 comprises a variable pole filter. The level of the variable pole filter can be selected by a user varying the contour control input signal 24 and is relative to a normalized level of amplified summed signal 41, as shown in FIG. 1, and may have the following contour setting table:

| Gain (dB) | Frequency at 3 dB (Hz) |
|---|---|
| – to +2 | 80 |
| −2 to +6 | 90 |
| +6 to +8 | 100 |
| +8 to +9 | 110 |
| +9 to +10 | 120 |
| +10 to +11 | 130 |
| +11 to +12 | 140 |

It is apparent that the values shown in the above contour setting table could be more continuous or less continuous, or could contain other suitable values. It is also apparent that the process controller, as shown in FIG. 1 and/or in FIG. 2, can operate within a similar range of zero to 12 dB. It is also possible for the range to extend beyond 12 dB.

High-pass filter 15, low-pass filter 20, high-pass section 26 of bandpass filter 25, low-pass section 28 of bandpass filter 25 and/or the filter section of control signal generator 30 each preferably comprises a suitable one-pole infinite-impulse-response (IIR) filter known to those skilled in the art. It is apparent that other filters equivalent to an IIR filter, such as an equivalent fmite-impulse-response (FIR) filter or others known to those skilled in the art, can also be used with the method and system according to this invention. The particular filter design may be a function of the type of computer hardware and/or software used to accomplish the method of this invention.

Voltage input waveform 10 also passes through bandpass filter 25 which comprises high-pass section 26 and low-pass section 28. The digital signal of voltage input waveform 10 passes through high-pass section 26 as shown in FIG. 1, or through high-pass section 26' as shown in FIG. 2, which emits digital signal 27 at a frequency above a predetermined high-pass frequency setpoint. In one preferred embodiment according to this invention, high-pass section 26 as shown in FIG. 1 or high-pass section 26' as shown in FIG. 2 has a high-pass frequency setpoint of about 210 Hz; however, it is apparent that the high-pass frequency setpoint of high-pass section 26 or high-pass section 26' can be set at any suitable value. As shown in FIG. 1, digital signal 27 passes through low-pass section 28 of bandpass filter 25 which emits digital signal 29, preferably at a midrange-frequency which is between a low-pass frequency setpoint and the high-pass frequency setpoint of bandpass filter 25. As shown in FIG. 2, digital signal 27 without the restriction of low-pass section 28 passes directly to control signal generator 30. In one preferred embodiment according to this invention, low-pass section 28 of the bandpass filter 25 operates at a low-pass frequency setpoint of about 2.4 kHz; however, it is apparent that the low-pass frequency setpoint of low-pass section 28 can be set at any suitable value.

As shown in FIGS. 1 and 2, digital signal 27 which is at frequencies only above the high-pass frequency setpoint of high-pass section 26 or 26' pass to control signal generator 30 of dynamically controlled multiplier 12. The dashed lines in FIGS. 1 and 2 represent elements that form dynamically controlled multiplier 12. In one preferred embodiment according to this invention, control signal generator 30 controls the level of high-frequency boost as a function of the characteristics of dynamically controlled signal 31. As shown in FIGS. 1 and 2, according to preferred embodiments of this invention, dynamically controlled multiplier 12 comprises control signal generator 30, a process controller that produces control input signal 32, and multiplier 13.

Figure 3:
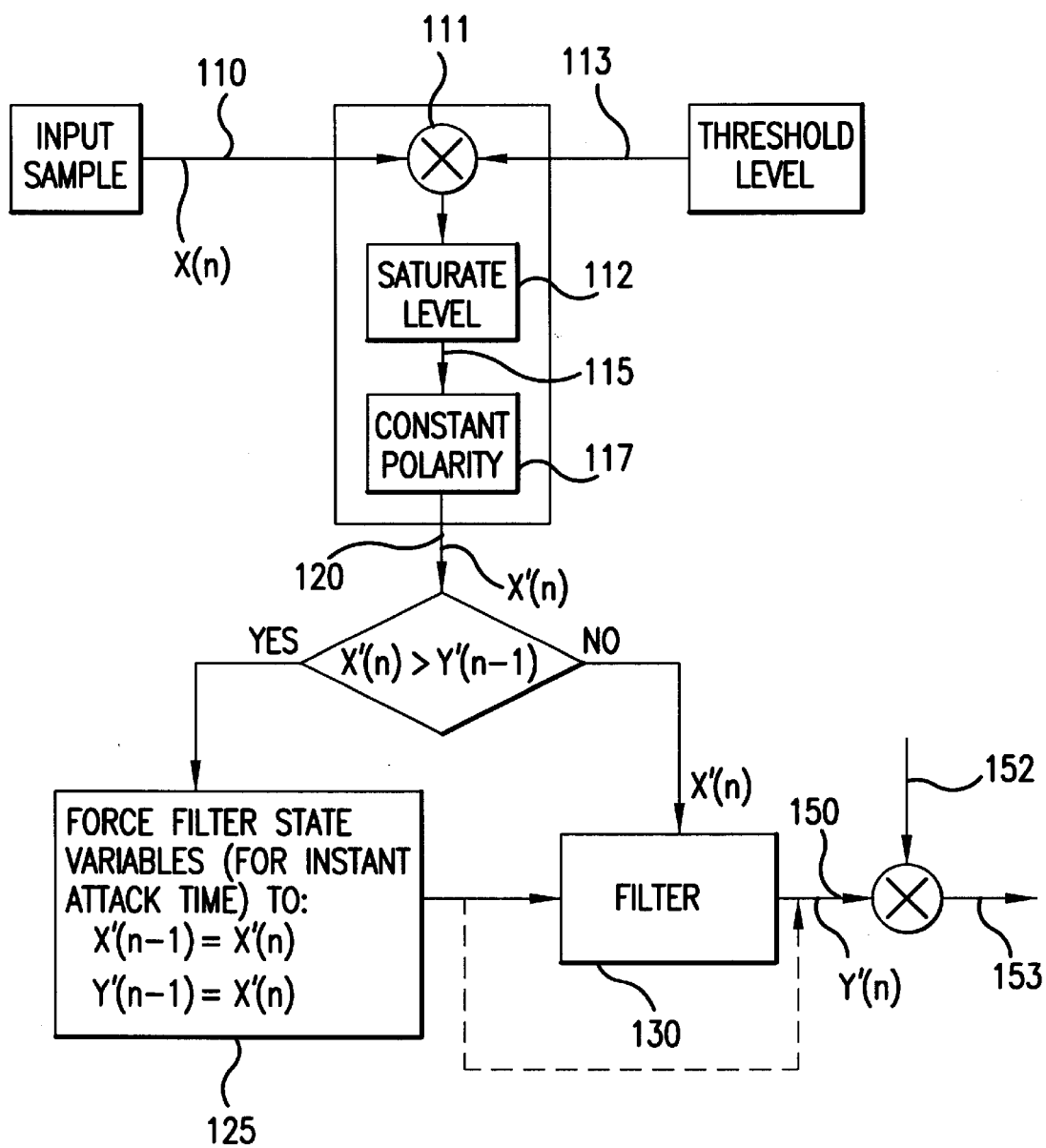
FIG. 3 is a flowchart showing a method and system for converting a digital control signal, according to one preferred embodiment of this invention.
Figure 4:
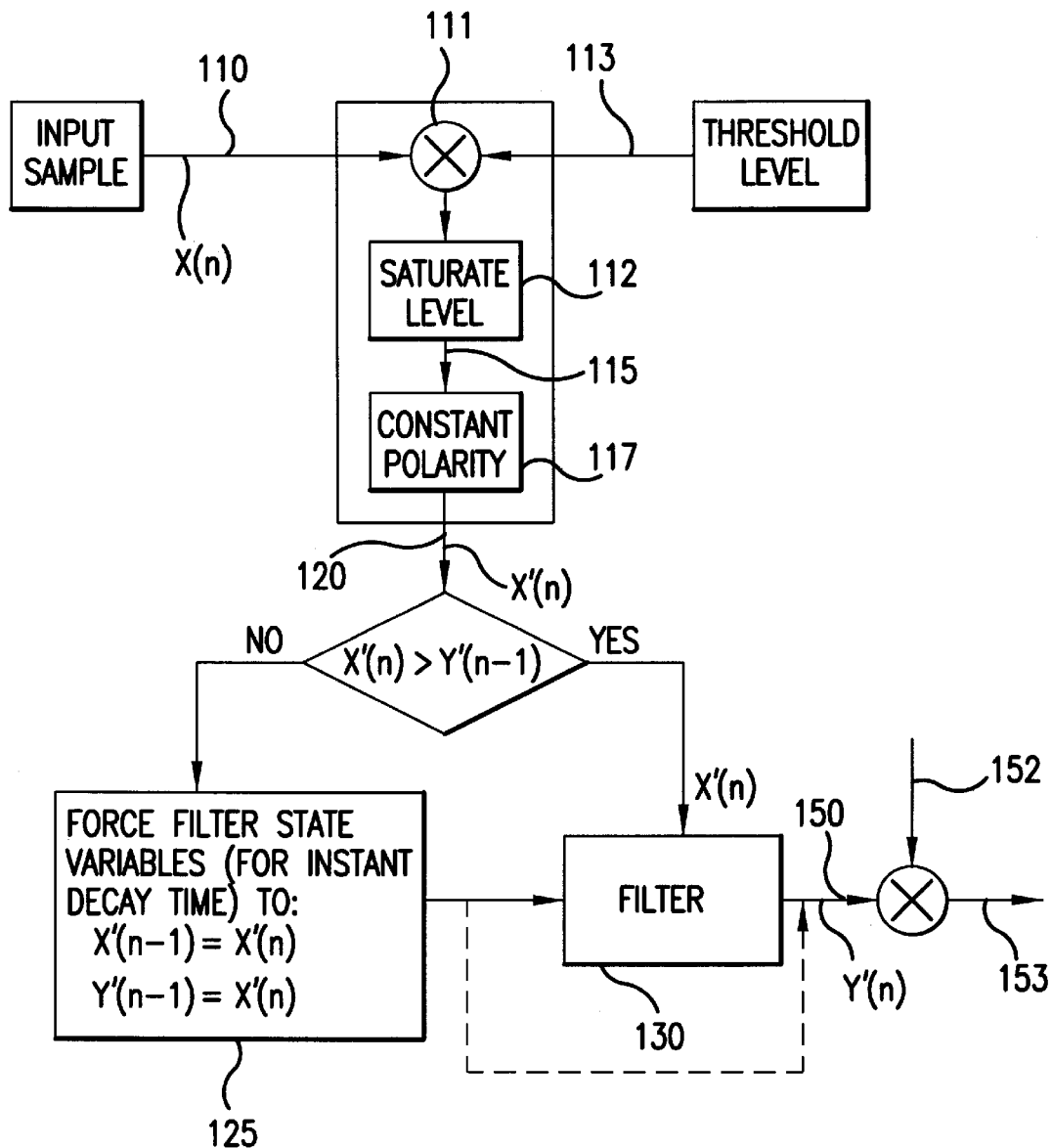
FIG. 4 is a flowchart showing a method and system for converting a digital control signal, according to another preferred embodiment of this invention.

FIGS. 3 and 4 show preferred embodiments of dynamically-controlled multiplier 60, which is shown by the phantom lines in FIG. 2. The steps of the method and system shown in FIGS. 3 and 4, from input signal 110 through present output signal 150, represent preferred embodiments that perform the operations shown in the dashed lines corresponding to dynamically-controlled multiplier 12, as shown in FIGS. 1 and 2.

As shown in FIG. 3, the method according to one preferred embodiment of dynamically-controlled multiplier 12 preferably begins with adjusting a sensitivity and a saturation point or level of a control voltage of input signal 110, such as by multiplying input signal 110 by signal 113 which has a particular threshold level. A magnitude of input signal 110 is preferably but not necessarily less than one or unity. The threshold level of signal 113 preferably but not necessarily corresponds to a number greater than one or unity.

At saturation step 112 as shown in FIG. 3, a saturation point or level of a control voltage of input signal 110 is adjusted. In one preferred embodiment of this invention, any saturation point or level having a magnitude greater than one or unity is adjusted to ±1. As shown in FIG. 3, input signal 110 is multiplied by signal 113 at multiplier 111.

A constant polarity of adjusted signal 115 is computed at constant-polarity computation step 117 and produces constant-polarity signal 120. Constant-polarity computation step 117 rectifies a waveform associated with input signal 110. It is apparent that any other suitable operation for deriving a constant-polarity signal, such as a squaring function or an absolute value computation can be used to achieve the constant polarity. Constant-polarity signal 120, also shown as X'(n) in FIG. 3, can be referred to as a threshold-compensated constant-polarity of input signal 110, which is also shown as X(n) in FIG. 3. In one preferred embodiment according to this invention, constant-polarity signal 120 has an instant attack time and an instant decay time.

As used throughout this specification and in the claims, the word "instant" or any related form of the word, such as when used to describe the attack time or the decay time, is intended to relate to an event theoretically occurring over zero time but practically occurring over a time period equal to approximately one PCM sample period or approximately a few PCM sample periods. Also as used throughout this specification and in the claims, the word "slow" or any related form of the word, such as when used to describe the attack time or the decay time, is intended to relate to an event occurring over a time period of a plurality of PCM samples or several PCM samples. An instant attack time of the method and system according to this invention is preferably achieved by passing constant-polarity signal 120 to filter 130 as a function of a comparison between a present constant-polarity signal 120 and previous output signal 150'.

According to one preferred embodiment, the method of this invention compares a first magnitude of at least one sample, preferably only one sample, of constant-polarity signal 120 to a second magnitude of at least one sample, preferably only one sample, of previous output signal 150'. Present output signal 150 is represented in FIGS. 3 and 4 as Y'(n) and previous output signal 150' is represented in FIGS. 3 and 4 as Y'(n−1). Initially, at time equal to zero and before previous output signal 150' exists, state variables are preset for filter 130, such as at re-initializing step 125 as shown in FIG. 3. After time equal to zero, the state variables can change over time as a function of changes of input signal 110. In one preferred embodiment of this invention, the at least one state variable is re-initialized to a present sample value of constant-polarity signal 120.

With an instant attack time as shown in FIG. 3 or an instant decay time as shown in FIG. 4, present output signal 150 will instantaneously track input signal 110. In one preferred embodiment according to this invention, present output signal 150 has an attack time less than the sample period corresponding to one PCM sample.

In one preferred embodiment of this invention, according to the flowchart of FIG. 3, if after comparing the first magnitude to the second magnitude it is determined that the first magnitude is greater than the second magnitude, then at least one state variable of filter 130 is re-initialized, such as at re-initializing step 125. In such preferred embodiment, if the first magnitude is less than the second magnitude, then constant-polarity signal 120 passes through filter 130 which emits present output signal 150.

In another preferred embodiment of this invention, as shown in the flowchart of FIG. 4, if after comparing the first magnitude to the second magnitude it is determined that the first magnitude is less than the second magnitude, then at least one state variable of filter 130 is re-initialized, such as at re-initializing step 125. In such preferred embodiment, if the first magnitude is greater than the second magnitude, then constant-polarity signal 120 passes through filter 130 which emits present output signal 150.

The dashed line in FIGS. 3 and 4 represents an alternative path, according to another preferred embodiment of the method according to this invention. It is possible for constant-polarity signal 120 to bypass filter 130, which will increase the operating speed of the method and the system according to this invention.

In one preferred embodiment according to this invention, filter 130 is a first-order filter. However, it is apparent that filter 130 can be an $n^{th}$-order filter. In other preferred embodiments according to this invention, filter 130 can be an infinite impulse response filter or a finite impulse response filter. Filter 130 is preferably a low-pass filter but can also be any other suitable filter known to those skilled in the art of digital signal processing.

As shown in FIG. 3, digital signal 152 can be multiplied with present output signal 150 to produce dynamically-controlled signal 153. In one preferred embodiment according to this invention, input signal 110 and/or digital signal 152 can be an audio signal or any other suitable signal which would be apparent to those skilled in the art of electronic signals. In one preferred embodiment of this invention, input signal 110 and digital signal 152 are derived from the same original signal source, such as but not limited to an audio signal. It is apparent that dynamically-controlled signal 153 can be used with many different systems, such as a sound system, a modem and/or the like.

A process controller that provides control input signal 32 allows a user to adjust the level of high-frequency portion 16 of the signal using multiplier 13. Control input signal 32 is multiplied by dynamically-controlled signal 31 to produce boost signal 33 which controls multiplier 13. Multiplier 13 is used to modify, preferably in the digital domain, high-frequency portion 16 of the signal to produce multiplied high-frequency signal 17. By operating in a digital domain, dynamically-controlled amplifier 12 of this invention operates more efficiently and more closely approaches ideal conditions than does a voltage-controlled amplifier operating in an analog domain. According to one preferred embodiment of this invention, by operating in a digital domain, it is possible to re-initialize decay filter state variables of a decay filter in order to achieve a fast attack time.

As shown in FIGS. 1 and 2, digital signal 27 first passes through control signal generator 30. In one preferred embodiment according to this invention, control signal generator 30 comprises an algorithm that provides adjustment of the output voltage within a given range, and emits dynamically-controlled signal 31. In one preferred embodiment according to this invention, control signal generator 30 has a decay time of approximately 200 ms to decreasing signal levels, an instant attack time to increasing signal levels, and a threshold level of about 36 dB. For example, as shown in FIG. 2, if high-frequency portion 16 is not summed at summer 51', then it may be necessary to modify the threshold level from 36 dB so that the net result is the same as if high-frequency portion 16 is summed at summer 51'. However, it is apparent that control signal generator 30 may have other design setpoints or parameters, depending upon the desired input to multiplier 34. In one preferred embodiment according to this invention, dynamically controlled signal 31 increases in a linear fashion in response to a changing digital signal 27, until digital signal 27 reaches a level of −36 dB at which controlled signal 31 represents a maximum level.

As shown in FIG. 1, the process controller delivers control input signal 32 to multiplier 34 which produces boost signal 33. A user can adjust the process controller to vary control input signal 32 and thus vary boost signal 33. As shown in FIG. 1, boost signal 33 controls the factor of multiplier 13. As shown in FIG. 2, the process controller delivers control input signal 32 to multiplier 34 which produces multiplied high-frequency signal 17.

As used throughout this specification and in the claims, the words "sum," "summed" or "summing" are intended to relate to a step or a component for adding two or more signals, regardless of the polarity of each signal. For example, summing two signals could relate to adding two non-inverted signals, adding two inverted signals, or adding one non-inverted signal and one inverted signal.

In one preferred embodiment according to this invention as shown in FIG. 1, digital signal 29 is summed with inverted low-frequency portion 21 of the input signal at summer 36 and result in first summed signal 35. First summed signal 35 is summed with inverted high-frequency portion 16 of the input signal at summer 42, resulting in second summed signal 40 which is multiplied and results in scaled summed signal 41. Scale factor 43 is preferably used to normalize the level of second summed signal 40. Multiplied high-frequency signal 17 is summed with inverted scaled summed signal 41 at summer 46, resulting in third summed signal 45.

In another preferred embodiment of this invention as shown in FIG. 2, at least multiplied high-frequency signal 17, multiplied low-frequency signal 22 and inverted digital signal 29 are summed at summer 51'. High-frequency portion 16 may or may not be summed at summer 51', as shown in FIG. 2. If high-frequency portion 16 is not summed at summer 51', then it may be necessary to modify threshold settings of control signal generator 30.

As shown in FIG. 1, inverted low-frequency portion 21 of the signal is multiplied and results in multiplied low-frequency signal 22. Multiplier 23 is preferably used to control the level of low-frequency portion 21 of the signal. A contour controller can be used to deliver control input signal 24 to control the factor of multiplier 23. A user can variably adjust the contour controller to enhance the low-frequency audio effect. The process controller and/or the contour controller of this invention can be interfaced with various control devices, such as an on-screen display or other indicator that relates to control input signal 32 and/or control input signal 24.

Also as shown in FIG. 1, amplified low-frequency signal 22 is summed with third summed signal 45 at summer 51, resulting in fourth summed signal 50. Fourth summed signal 50 can then be delivered, preferably as a digital signal, to a digital-to-analog convertor or can be further digitally processed. In one preferred embodiment of the method according to this invention, summed signal 50 is converted to an analog signal and delivered through an audio output device, for example.

The high-frequency portion 16 of the signal is preferably but not necessarily multiplied in a non-linear manner. For example, as shown in FIG. 1, high-frequency portion 16 of the signal is multiplied by boost signal 33 to produce multiplied high-frequency signal 17 which may vary as a function of digital signal 27, possibly in a non-linear fashion. All linear functions or steps of the method according to this invention can be performed in any suitable order.

In an analog domain, roles equivalent to the roles of summers 36, 42, 46 and/or 51 and/or of multiplier 44 of this invention can be accomplished with an audio processor which is commercially available from EXAR Corporation, San Jose, Calif., for example, with a model XR-1071 audio processor.

One preferred embodiment of this invention as shown in FIG. 1 can be constructed with a conventional digital signal processor, such as a DSP56K family digital signal processor, as manufactured by Motorola, Inc. The DSP56K family relates to a modular chip layout with a standard central processing module which supports memory expansion options, on-chip peripherals and various package sizing. The DSP56K family of chips is particularly suitable for accomplishing the method of and building a system according to this invention because of the relatively small chip size, which occupies less space on a printed circuit board. Reducing space requirements on printed circuit boards is very desirable, particularly when designing audio systems and hardware. It is apparent that other suitable microprocessors, such as those manufactured by Intel Corporation, Santa Clara, Calif.; Texas Instruments, Dallas, Tex.; Analog Devices, Norwood, Mass.; Medianix Semiconducter, Inc., Mountain View, Calif.; SGS-Thomson Microelectronics and others, can be used to accomplish one or more steps of the method according to this invention.

While in the foregoing specification this invention has been described in relation to certain preferred embodiments thereof, and many details have been set forth for purpose of illustration it will be apparent to those skilled in the art that this invention is susceptible to additional embodiments and that certain of the details described can be varied considerably without departing from the basic principles of this invention.

I claim:

1. A method for enhancing a digitally sampled voltage input waveform, comprising:

(a) passing the digitally sampled voltage input waveform (10) through a high-pass filter (15) and emitting a high-frequency portion (16) of a signal;

(b)) passing the digitally sampled voltage input waveform (10) through a low-pass filter (20) and emitting a low-frequency portion (21) of the signal;

(c) passing the digitally sampled voltage input waveform (10) through a high-pass section (26) of a bandpass filter (25) and emitting a first digital signal (27) at a first frequency above a high-pass frequency of the bandpass filter (25), and passing the first digital signal (27) through a low-pass section (28) of the bandpass filter (25) and emitting a second digital signal (29) at a midrange-frequency between a low-pass frequency and the high-pass frequency of the bandpass filter (25);

(d) passing the first digital signal (27) through a control signal generator (30) and emitting a dynamically-controlled digital signal (31);

(e) summing the low-frequency portion (21) of the signal and the second digital signal (29) producing a first-summed digital signal (35);

(f) summing the first-summed digital signal (35) and the high-frequency portion (16) of the signal producing a second summed digital signal (40);

(g) multiplying the second summed digital signal (40) producing a scaled second summed digital signal (41); and (h) multiplying the high-frequency portion (16) of the signal producing a multiplied high-frequency digital signal (17) by varying the dynamically-controlled digital signal (31) to control a factor of multiplication of the high-frequency portion (16) of the signal, summing the multiplied high-frequency digital signal (17) and the scaled second summed digital signal (41) producing a third summed digital signal (45), multiplying the low-frequency portion (21) of the signal and a first control input signal (24) producing a multiplied low-frequency digital signal (22), and summing the third summed digital signal (45) and the multiplied low-frequency digital signal (22) producing a fourth summed digital signal (50).

2. A method according to claim 1 wherein an output level of the dynamically-controlled digital signal (31) is saturated at a threshold level of the first digital signal (27).

3. A method according to claim 2 wherein the dynamically-controlled digital signal (31) and a second control input signal (32) are multiplied to produce a boost signal (33).

4. A method according to claim 3 wherein the boost signal (33) controls a factor of multiplication of the high-frequency portion (16) of the digital signal to produce the multiplied high-frequency digital signal (17) that is summed with the scaled second suimmned digital signal (41).

5. A method according to claim 3 wherein at least one of the first control input signal (24) and the second control input signal (32) is variable.

6. A method according to claim 1 wherein a level of multiplication of the low-frequency portion (21) of the signal is variably controlled to produce the multiplied low-frequency digital signal (22) that is summed with the third summed digital signal (45).

7. A method according to claim 1 wherein the high-pass section (26) of the bandpass filter (25) has a high-pass frequency setpoint of about 210 Hz.

8. A method according to claim 1 wherein the low-pass section (28) of the bandpass filter (25) has a low-pass frequency setpoint of about 2.4 kHz.

9. A method according to claim 1 wherein the low-pass filter (20) is a variable pole filter.

10. A method according to claim 1 wherein the high-pass filter (15) has a high-pass frequency setpoint of about 3.8 kHz.

11. A method according to claim 1 wherein the dynamically-controlled digital signal (31) has a decay time of about 200 ms.

12. A method according to claim 1 wherein the dynamically-controlled digital signal (31) has an attack time that is instantaneous.

13. A method for enhancing a digital input signal, wherein the digital input signal is passed through a high-pass filter, a low pass filter and a bandpass filter, the method comprising:

(a) passing the digital input signal (10) through the high-pass filter (15) and emitting a high-frequency portion (16) of a signal:

(b) passing the digital input signal (10) though the low-pass filter (20) and emitting a low-frequency portion (21) of the signal;

(c) passing the digital input signal (10) through a bandpass filter (25) to produce a first digital signal (27) at a first frequency above a high-pass frequency setpoint;

(d) passing the first digital signal (27) to a control signal generator (30) and emitting from the control signal generator (30) a dynamically-controlled digital signal (31);

(e) generating a constant control signal (32) from a process controller;

(f) multiplying the dynamically-controlled digital signal (31) and the constant control signal (32) to produce a boost signal (33);

(g) multiplying the boost signal (33) and the high-frequency portion (16) of the signal to produce a multiplied high-frequency digital signal (17); and (h) combining the multiplied high-frequency digital signal (17) and a processed of the low-frequency portion (21) of the signal.

14. A method for enhancing a digitally sampled voltage input waveform, comprising:

(a) passing the digitally sampled voltage input waveform (10) through a high-pass filter (15) and emitting a high-frequency portion (16) of a signal;

(b) passing the digitally sampled voltage input waveform (10) through a low-pass filter (20) and emitting a low-frequency portion (21) of the signal and multiplying the low-frequency portion (21) of the signal and a first control input signal (24) producing a multiplied low-frequency digital signal (22);

(c) passing the digitally sampled voltage input waveform (10) through a second high-pass filter (26') and emitting a first digital signal (27) and passing the first digital signal (27) through a control signal generator (30) and emitting a dynamically-controlled digital signal (31);

(d) passing the digitally sampled voltage input waveform (10) through a bandpass filter (25) and emitting a second digital signal (29);

(e) multiplying the high-frequency portion (16) of the signal, the dynamically-controlled digital signal (31) and a control digital input signal (32) producing a multiplied high-frequency digital signal (17); and (f) summing the multiplied high-frequency digital signal (17), the multiplied low-frequency digital signal (22) and the second digital signal (29) producing a summed digital signal (50).

15. A method according to claim 14, further comprising summing the high-frequency portion (16) of the signal with the multiplied high-frequency digital signal (17), the multiplied low-frequency digital signal (22) and the second digital signal (29) to produce the summed digital signal (50).

16. A method according to claim 14, wherein a level of multiplication of the low-frequency portion (21) of the signal is variably controlled to produce the multiplied low-frequency digital signal (22).

* * * * *